(12) United States Patent
Angyal et al.

(10) Patent No.: US 7,009,280 B2
(45) Date of Patent: Mar. 7, 2006

(54) LOW-K INTERLEVEL DIELECTRIC LAYER (ILD)

(75) Inventors: Matthew Angyal, Stormville, NY (US);
Edward Paul Barth, Ridgefield, CT (US); Sanjit Kumar Das, Poughkeepsie, NY (US); Charles Robert Davis, Fishkill, NY (US); Habib Hichri, Wappingers Falls, NY (US); William Francis Landers, Wappingers Falls, NY (US); Jia Lee, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 10/709,320

(22) Filed: Apr. 28, 2004

(65) Prior Publication Data

US 2005/0242414 A1   Nov. 3, 2005

(51) Int. Cl.
*H01L 23/58* (2006.01)
(52) U.S. Cl. ............... 257/642; 257/635; 257/750; 257/759; 257/760; 257/762; 257/773
(58) Field of Classification Search ............... None
See application file for complete search history.

(56) References Cited

U.S. PATENT DOCUMENTS

| 6,218,302 | B1 * | 4/2001 | Braeckelmann et al. ..... 438/687 |
| 6,436,808 | B1 | 8/2002 | Ngo et al. |
| 6,475,925 | B1 * | 11/2002 | Braeckelmann et al. ..... 438/763 |
| 6,483,173 | B1 | 11/2002 | Li et al. |
| 6,518,646 | B1 * | 2/2003 | Hopper et al. ............... 257/642 |
| 6,528,432 | B1 | 3/2003 | Ngo et al. |
| 6,541,374 | B1 * | 4/2003 | de Felipe et al. ........... 438/648 |
| 2004/0127016 | A1 * | 7/2004 | Hoog et al. ................ 438/637 |

\* cited by examiner

*Primary Examiner*—Andy Huynh
(74) *Attorney, Agent, or Firm*—Howard M. Cohn; H. Daniel Schnurmann

(57) ABSTRACT

An interlevel dielectric layer (ILD) comprises a low-k dielectric layer; and a low-k dielectric film, deposited under compressive stress, atop the dielectric layer. The dielectric layer comprises a low-k material, such as an organosilicon glass (OSG) or a SiCOH material. The dielectric film has a thickness, which is 2%–10% of the thickness of the dielectric layer, has a similar chemical composition to the dielectric layer, but has a different morphology than the dielectric layer. The dielectric film is deposited under compressive stress, in situ, at or near the end of the dielectric layer deposition by altering a process that was used to deposit the low-k dielectric layer.

17 Claims, 1 Drawing Sheet

LOW-K INTERLEVEL DIELECTRIC LAYER (ILD)

BACKGROUND OF INVENTION

The invention relates to the fabrication of integrated circuit (IC) devices, particularly to dielectric materials, and more particularly to the fabrication of a low-k interlevel dielectric layer (ILD).

Semiconductor devices are typically joined together to form useful circuits using interconnect structures comprising conductive materials (e.g., metal lines) such as copper (Cu) or aluminum (Al) and dielectric materials such as silicon dioxide ($SiO_2$). The speed of these interconnects can be roughly assumed to be inversely proportional to the product of the line resistance (R), and the capacitance (C) between lines. To reduce the delay and increase the speed, it is desirable to reduce the capacitance (C). This can be done by reducing the dielectric constant k of the dielectric material in the interlevel dielectric layers (ILDs). Thus, there is considerable interest in developing low-k materials as well as deposition methods for them that are compatible with integrated circuit technology.

A common dielectric material for use in an interlevel dielectric layer (ILD) is silicon dioxide (SiO2, also referred to herein simply as "oxide"). Oxide has a dielectric constant k of at least 3.85, and typically 4.1–4.3 or higher. Air has a dielectric constant k of approximately 1.0. By definition, a vacuum has a dielectric constant k of 1.0.

Low-k dielectric materials are known, and are typically defined as materials having a dielectric constant k less than 3.85—in other words, less than that of oxide. A variety of low-k materials are known. They can generally be characterized by their composition and/or by the way in which they typically are deposited.

Deposition is a process whereby a film of either electrically insulating (dielectric) or electrically conductive material is deposited on the surface of a semiconductor wafer. Chemical Vapor Deposition (CVD) is used to deposit both dielectric and conductive films via a chemical reaction that occurs between various gases in a reaction chamber. Plasma Enhanced Chemical Vapor Deposition (PECVD) uses an inductively coupled plasma to generate different ionic and atomic species during the deposition process. PECVD typically results in a low temperature deposition compared to the corresponding thermal CVD process. Spin-on deposition is used to deposit materials such as photoresist, and can also be used to deposit dielectric materials. In an example of spin-on deposition, a wafer is coated with material in liquid form and then spun at speeds up to 6000 rpm, during which the liquid is uniformly distributed on the surface by centrifugal forces. This step is followed by a low temperature bake which solidifies the material.

Examples of spin-on low-k materials include:
BCB (divinylsiloxane bisbenzocyclobutene), sold by Dow Chemical.
SiLK™, an organic polymer with k=2.65, similar to BCB, sold by Dow Chemical.
NANOGLASS™, an inorganic porous polymer with k=2.2, sold by Honeywell.
FLARE 2.0™ dielectric, an organic low-k poly(arylene) ether available from Allied Signal, Advanced Microelectronic Materials, Sunnyvale, Calif.
Inorganic materials such as spin-on glass (SOG), fluorinated silicon glass (FSG) and, particularly, methyl-doped porous silica which is referred to by practitioners of the art as black diamond, or BD.
Organo-silicate materials, such as JSR LKD 5109 (a spin-on material from japan Synthetic Rubber).
Organic polymers (fluorinated or non-fluorinated), inorganic polymers (nonporous), inorganic-organic hybrids, or porous materials (xerogels or aerogels).
Materials in the parylene family of polymers, the polynapthalene family of polymers, or polytetrafluoroethylene.

Examples of low-k Chemical Vapor Deposition (CVD) and Plasma Enhanced CVD (PECVD) low-k materials include:
Black Diamond™, an organosilicon glass (OSG) which is a Si—O—C—H type of material with a dielectric constant k of 2.7 to 3.0 (e.g., 2.9), sold by Applied Materials Inc.
CORAL™, also an organosilicon glass (OSG) which is a Si—O—C—H type of material with a k of 2.7–3.0, sold by Novellus Systems, Inc.
fluorinated SiO2 glass, and amorphous C:F.

It is known that pores in dielectric materials can lower the dielectric constant. Low-k dielectric materials can typically be deposited ab initio either with or without pores, depending on process conditions. Since air has a near 1 dielectric constant, porous films exhibit reduced dielectric constants as compared with the dielectric constants of the base material in which they are developed. Generally, it is the spin-on materials (e.g., SiLK, NANOGLASS) that exhibit a high degree of porosity. The PECVD materials generally do not exhibit such a high degree of porosity due to the method of deposition. As a result, it is very difficult to prepare a CVD film with a k value of <2.5.

The use of low-k (<3.9) materials, with or without pores, is well known for use as an Interlevel Dielectric Layer (ILD). Sometimes, materials having k<2.5 are referred to as "ultralow-k".

Dual damascene structures have received widespread application in recent years. Generally, a dual damascene structure comprises a via etched through a first dielectric layer and a trench etched through a second, overlying dielectric layer. The via and trench are over-filled with metal (usually copper) and then planarized with chemical mechanical polishing (CMP). An example of a dual damascene structure is illustrated in U.S. Pat. No. 6,538,839.

A problem with some low-k materials, particularly those that are organic in nature, is that they are generally not compatible with chemical mechnical polishing (CMP). Because of their organic nature these materials are innately soft This physical property of beong soft can give rise to problems during semiconductor processing, particularly during planarization, by chemical mechanical polishing (CMP).

As noted in U.S. Pat. No. 6,538,839, inorganic low-k dielectrics enjoy several advantages over the organic variety, such as good thermal conductivity suitability for production. But one problem associated with them is that when in thin film form, they are found to be in a state of high tensile stress. This is the case, regardless of how they are deposited. Because these low-k inorganic films have a tendency to delaminate, particularly near the edges of the substrate where the restoring forces are the strongest.

SUMMARY OF INVENTION

It is therefore an aspect of the invention to provide an improved technique for forming an Interlevel Dielectric Layer (ILD), particularly a low-k ILD.

According to the invention, an interlevel dielectric layer (ILD) comprises a low-k dielectric layer; and a low-k dielectric film, deposited under compressive stress atop the dielectric layer. The dielectric layer comprises a low-k material, such as an organosilicon glass (OSG) or a SiCOH material. The dielectric film has a thickness of 2%–10% of the thickness of the dielectric layer, a similar chemical composition to the dielectric layer, but a different morphology than the dielectric layer. The dielectric film is deposited under compressive stress, in situ , at or near the end of the dielectric layer deposition by altering a process that was used to deposit the low-k dielectric layer.

BRIEF DESCRIPTION OF DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines that would otherwise be visible in a "true" cross-sectional view, for illustrative clarity.

DETAILED DESCRIPTION

Figure 1:
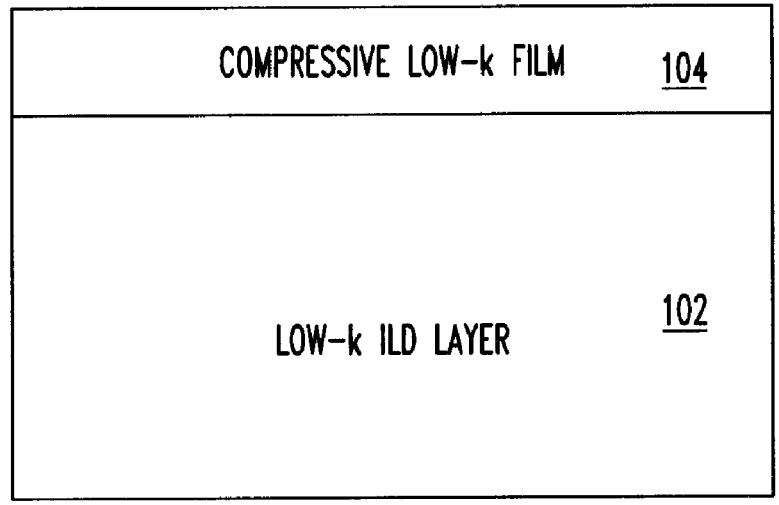
FIG. 1 is a cross-sectional view of a relevant portion of a semiconductor device—namely, an interlevel dielectric layer (ILD)—illustrating a first step in a process of forming the ILD, according to the invention.

In the description that follows, numerous details are set forth in order to provide a thorough understanding of the present invention. It will be appreciated by those skilled in the art that variations of these specific details are possible while still achieving the results of the present invention. Well-known elements and processing steps are generally not described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred simply as "oxide" or by its chemical formula SiO2.

In the description that follows, exemplary dimensions may be presented for an illustrative embodiment of the invention. The dimensions should generally not be interpreted as limiting. They are included to provide a sense of proportion. Generally speaking, it is the relationship between various elements, where they are located, their contrasting compositions, and sometimes their relative sizes that is of significance.

In the drawings accompanying the description that follows, often both reference numerals and legends (labels, text descriptions) may be used to identify elements. If legends are provided, they are intended merely as an aid to the reader, and should not in any way be interpreted as limiting.

FIG. 1 is a cross-sectional view of a relevant portion of a semiconductor device—namely, an interlevel dielectric layer (ILD) 100—formed according to the techniques of the present invention. The ILD 100 comprises a low-k primary dielectric layer 102 and a compressive low-k dielectric film 104 deposited atop the primary dielectric layer 102. (The primary dielectric layer 102 can be two layers, in a dual damascene process.) As is known in the art, the primary dielectric layer 102 is deposited on the surface of a semiconductor wafer (not shown).

The compressive low-k dielectric film 104 is deposited to serve as a hard mask for the primary dielectric layer 102. In an embodiment of the invention, the compressive low-k dielectric film 104 is deposited, at or near the end of the primary dielectric layer 102 deposition. The deposition is accomplished by altering the process conditions (e.g., gas flow, power, pressure, bias) which were being used to deposit the primary dielectric layer 102 to yield a film 104 under compressive stress while maintaining a low dielectric constant. The film 104 also possesses properties that enable it to function as a polish stop layer during copper chemical mechanical polishing (CMP).

Figure 2:
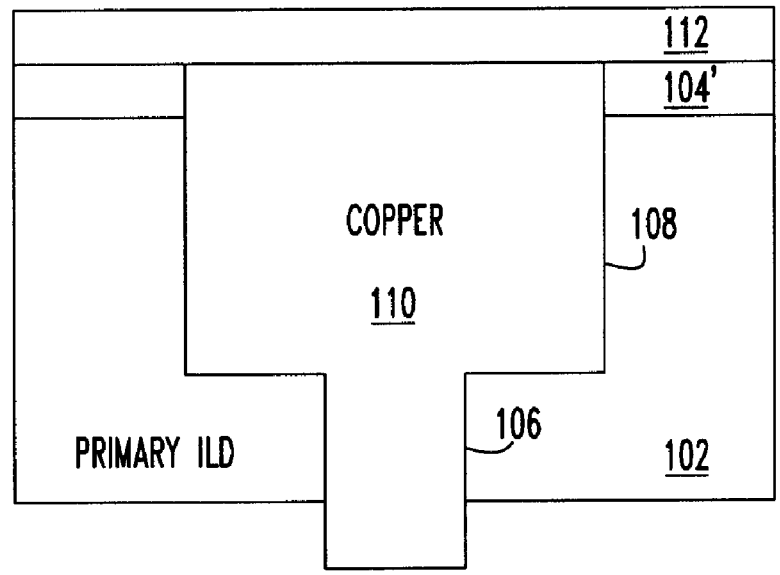
FIG. 2 is a cross-sectional view illustrating further steps in the process, according to the invention.

FIG. 2 is a cross-sectional view of a further step in the process, illustrating that a via 106 and a trench 108 have been formed in the ILD 100, and the via 106 and trench 108 have been filled with damascene copper (Cu) 110. The process of forming damascene copper interconnects in an ILD is well known, and the steps involved (e.g., barrier, liner, copper seed, plate) are omitted, for illustrative clarity.

The resulting interconnect structure (ILD with copper) is subjected to chemical mechanical polishing (CMP), which planarizes the top surface of the interconnect structure and also thins compressive low-k dielectric film, designated 104' in this figure. Following the steps of forming damascene copper and subjecting it to CMP, a dielectric cap 112, such as nitrogen-doped silicon carbide or Si—N—C—H (NBLOk) is deposited on the resulting structure. The dielectric cap 112 should also be under compressive stress.

The primary dielectric layer 102 has a thickness of 500–20,000 Å (Angstroms) and preferably between 1000–15,000 Å. The primary ILD layer 102 is a low-k material such a SiCOH material, such as Black Diamond™, an organosilicon glass (OSG).

The compressive film 104 has a thickness of 200–2000 Å and preferably between 350–1000 Å. The compressive film 104 has similar chemical composition to the primary dielectric layer 102, but different morphology (mechanical properties).

Being denser than the primary dielectric layer 102, the compressive film 104 has a higher dielectric constant than the primary dielectric layer 102. Therefore, it is desirable to keep the compressive film 104 as thin as possible to reap the desired mechanical benefits without unnecessarily sacrificing the overall low-k of the ILD 100. For example, the compressive film 104 has a thickness which is 2%–10% and preferably about 3% of the thickness of the primary dielectric layer 102. For example, the primary dielectric layer 102 has a thickness of 10,000 Å, and the compressive film has a thickness of 500 Å.

The dielectric cap 112 has a chemical composition $SiN_xC_yH_z$ (NBLOk) and has a thickness of 100–1000 Å and preferably about 250–500 Å.

Exemplary Process Conditions: Depositions were performed using a Plasma Enhanced Chemical Vapor Deposition (PECVD) tool from manufacturers such as Applied Materials, Novellus, and Tokyo Electron TEL.

Using the aforementioned PECVD tool or platform, to form the primary dielectric layer 102 on a semiconductor wafer. The wafer is secured to an electrostatic chuck in an enclosed tool chamber using conventional methods. Then the PECVD tool or platform is set to the following settings.

The top electrode is excited at a Radio Frequency (RF) of 13.5 MHz with a power of 300 to 700 Watts (W).

The bottom electrode is excited at a RF of 2 MHz with a power of 0 to 150 W.

The pressure of the chamber is set from 1–8 Torrs.

A precursor material tetramethylcyclotetrasiloxane (TMCTS) is introduced into the chamber at a flow rate of 15 to 2000 sccm (standard cubic centimeters per minute).

Oxygen (O2) is introduced into the chamber at a flow rate of 0 to 320 sccm.

Helium (He) is introduced into the chamber at a flow rate of 500 to 1500 sccm.

The electrostatic chuck has a heater set to a temperature of about 350° C. Note that this is the setting temperature. The actual heater temperature is about 320° C.

The gap space between the faceplate of the chuck and the heater is set to a distance of 28 to 48 millimeters (mm).

The center-to-edge flow ratio across the semiconductor wafer is 1 to 1. Note that he platform which was used allows the control of the gas flows through the center of the faceplate versus the control of flows through the edge of the faceplate.

After the primary dielectric layer 102 is deposited on a semiconductor wafer, a compressive low-k film 104 is deposited onto the dielectric layer. In this step of the process, the PECVD tool or platform is set to the following settings.

In one example, the PECVD tool or platform is set as follows.

The top electrode is excited at a Radio Frequency (RF) of 13.5 MHz with a power of 300 to 500 Watts (W).

The bottom electrode is excited at a RF of 2 MHz with a power of 0 to 200 W.

The pressure of the chamber is set from 1 to 8 Torrs.

A precursor material tetramethylcyclotetrasiloxane (TMCTS) is introduced into the chamber at a flow rate of 15 to 25 sccm (standard cubic centimeters per minute).

Helium (He) is introduced into the chamber at a flow rate of 180 to 420 sccm.

The electrostatic chuck has a heater set to a temperature of 350° C.

The gap space between the faceplate of the chuck and the heater is set to a distance of 28 to 48 mm.

The center-to-edge flow ratio across the semiconductor wafer is 1 to 1.

In a second example of depositing the compressive film 104, the PECVD tool or platform is set as follows.

The top electrode is excited at a Radio Frequency (RF) of 13.5 MHz with a power of 200 to 300 Watts (W).

The bottom electrode is excited at a RF of 2 MHz with a power of 0W.

The pressure of the chamber is set to 1 to 8 Torr.

A precursor material tetramethylcyclotetrasiloxane (TMCTS) is introduced into the chamber at a flow rate of 25 to 80 sccm (standard cubic centimeters per minute).

Helium (He) is introduced into the chamber at a flow rate of 420 to 900 sccm.

The electrostatic chuck has a heater set to a temperature of 350° C.

The gap space between the faceplate of the chuck and the heater is set to a distance of 28 to 48 mm.

The center-to-edge flow ratio across the semiconductor wafer is 1 to 1.

In a sample test of depositing the compressive film 104, the PECVD tool or platform was set as follows.

The top electrode is excited at a Radio Frequency (RF) of 13.5 MHz with a power of 300W.

The bottom electrode is excited at a RF of 2 MHz with a power of 0W.

The pressure of the chamber is set to 1 Torr.

A precursor material tetramethylcyclotetrasiloxane (TMCTS) is introduced into the chamber at a flow rate of 25 sccm.

Helium (He) is introduced into the chamber at a flow rate of 900 sccm.

The electrostatic chuck has a heater set to a temperature of 350° C.

The gap space between the faceplate of the chuck and the heater is set to a distance of 28 mm.

The center-to-edge flow ratio across the semiconductor wafer is 1 to 1.

The primary dielectric layer 102 exhibited a dielectric constant k of approximately 3.0.

The above three described process conditions (Example 1, Example 2, Sample test) generate a compressive SiCOH compressive film 104 with a low dielectric constant used both as a hard mask and as a CMP stop.

The deposition rate for the compressive film 104 is about 300–350 Å/min.

The compressive film 104 exhibits a dielectric constant k of approximately 3.58.

The compressive film 104 exhibits a stress of approximately $-1.1$ E9 dynes/crn2 ($-110$ MPa) The compressive film 104 exhibits a refractive index RI (633 nm) of 1.538 to 1.550.

The compressive film 104 exhibits a CMP rate of about 120 Å/min.

It is within the scope of the invention that other precursor materials can be used—for example, OctaMethyl cyclotetrasiloxane molecules (e.g. OMCTS)—to generate similar films.

Generally, for in situ deposition of the compressive film 104, the process parameters can be changed, the precursor can be changed, etc., to generate the desired morphology without (as discussed above) sacrificing the benefits of low-k. Generally, by altering the process parameters, as described above, the same elements with the same stoichiometry can result in a different film structure.

This invention provides for a compressive film 104 with a low dielectric constant that can be inserted and retained between each metallization level, thereby, reducing the stack's propensity to cracking by countering the tensile stress of the low-k CVD ILD 102 and thus enhancing the reliability and manufacturability of the low k CVD stack. The film 104 should also include properties such as, high polish selectivity, good barrier to moisture and oxygen and minimize damage to the underlying low k CVD dielectric 102 and provide adhesion to the underlying low k CVD dielectric 102. The film 104 should also be capable of being deposited in the same platform/tool as the underlying low-k CVD dielectric 102 without breaking vacuum.

The in-situ deposition of a highly compressive, low k, low CMP polish rate, and good moisture and oxygen barrier low k CVD material 104 on top of a low k (including ultralow-k) CVD ILD material 102 will provide an enhanced integration structure that exhibits good mechanical stability. In this manner, the overall manufacturability and reliability of the chip can be enhanced.

The primary ILD material 102 can be low-k (<3.9) or ultra low-k (<2.5), and can have pores. In the case that the primary ILD material 102 has pores, the compressive film 104 acts as a moisture barrier. Preferably, the compressive film 104 does not have pores, as this would necessitate the deposition of an additional moisture barrier over the compressive film 104.

The film 104 can be deposited in-situ as described above.

It is within the scope of the invention that the film 104 can be deposited ex-situ. For example, the primary ILD layer 102 can be deposited using spin-on techniques, using materials such as JSR or porous SiLK. Then, the substrate would be moved to another chamber right after the deposition of the primary ILD layer 102. Spin on low k material is generally tensile and thus the compressibility of the film 104 will enhance the overall strength of the integration stack.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

The invention claimed is:

1. An interlevel dielectric layer comprising:
   a dielectric layer; and
   a dielectric film, disposed atop the dielectric layer;
   wherein the dielectric film has similar chemical composition to the dielectric layer, but has different morphology than the dielectric layer.

2. The interlevel dielectric layer, according to claim 1, wherein the dielectric layer comprises a low-k material.

3. The interlevel dielectric layer, according to claim 1, wherein the dielectric layer comprises an organosilicon glass.

4. The interlevel dielectric layer, according to claim 1, wherein the dielectric layer comprises a SiCOH material.

5. The interlevel dielectric layer, according to claim 1, wherein:
   the dielectric layer has a thickness of 500–20,000 Å; and
   the dielectric film has a thickness of 200–2000 Å.

6. The interlevel dielectric layer, according to claim 1, wherein:
   the dielectric layer has a thickness of 1000–15,000 Å; and
   the dielectric film has a thickness of 350–1000 Å.

7. The interlevel dielectric layer, according to claim 1, wherein the dielectric film has a thickness which is 2%–10% of the thickness of the dielectric layer.

8. The interlevel dielectric layer, according to claim 1, wherein the dielectric film has a thickness which is approximately 3% of the thickness of the dielectric layer.

9. The interlevel dielectric layer, according to claim 1, wherein a dielectric cap is deposited on the dielectric film.

10. The interlevel dielectric layer, according to claim 1, wherein the dielectric film is denser than the dielectric layer.

11. An interlevel dielectric layer comprising:
    a dielectric layer; and
    a dielectric film disposed atop the dielectric layer;
    wherein:
    the dielectric layer has a thickness in the range of from greater than 12000 Å to 20000 Å; and
    the dielectric film has a thickness in the range of from greater than 1000 Å up to 2000 Å.

12. The interlevel dielectric layer, according to claim 11, wherein the dielectric layer comprises a low-k material.

13. The interlevel dielectric layer, according to claim 11, wherein the dielectric layer comprises an organosilicon glass.

14. The interlevel dielectric layer, according to claim 11, wherein the dielectric layer comprises a SiCOH material.

15. The interlevel dielectric layer, according to claim 11, wherein the dielectric film has similar chemical composition to the dielectric layer, but has different morphology than the dielectric layer.

16. The interlevel dielectric layer, according to claim 11, wherein a dielectric cap is deposited on the dielectric film.

17. The interlevel dielectric layer, according to claim 1, wherein the dielectric film is denser than the dielectric layer.

* * * * *